(12) United States Patent
Lowery et al.

(10) Patent No.: US 12,399,516 B2
(45) Date of Patent: Aug. 26, 2025

(54) FLOW RATIO CONTROLLER SYSTEM OPERATING IN ALTERNATIVE CONTROL MODES

(71) Applicant: HORIBA STEC, Co., Ltd., Kyoto (JP)

(72) Inventors: Patrick Lowery, Reno, NV (US); Maximilian Martin Gundlach, Reno, NV (US); Tadahiro Yasuda, Kyoto (JP); Andrew Price, Reno, NV (US)

(73) Assignee: HORIBA STEC, Co., Ltd., Kyoto (JP)

( * ) Notice: Subject to any disclaimer, the term of this patent is extended or adjusted under 35 U.S.C. 154(b) by 86 days.

(21) Appl. No.: 18/416,713

(22) Filed: Jan. 18, 2024

(65) Prior Publication Data

US 2025/0238044 A1 Jul. 24, 2025

(51) Int. Cl.
*G05D 11/13* (2006.01)
*G01F 25/10* (2022.01)

(52) U.S. Cl.
CPC .......... *G05D 11/132* (2013.01); *G01F 25/10* (2022.01)

(58) Field of Classification Search
CPC .............................. G05D 11/132; G01F 25/10
See application file for complete search history.

(56) References Cited

U.S. PATENT DOCUMENTS

| 10,031,005 B2 | 7/2018 | Ding |
| 10,996,689 B2 | 5/2021 | Yasuda et al. |
| 2015/0331430 A1 | 11/2015 | Yasuda et al. |
| 2022/0129021 A1* | 4/2022 | Okada .................. G05D 11/132 |

* cited by examiner

*Primary Examiner* — P. Macade Nichols
(74) *Attorney, Agent, or Firm* — Alleman Hall & Tuttle LLP

(57) ABSTRACT

A flow ratio controller system includes an inlet receiving a total inlet fluid flow from one or more inlet channels, distribution channels fluidically connected to the inlet and arranged in parallel in a branching flow path downstream of the inlet, and a controller. The distribution channels includes a hybrid distribution channel. The controller selectively operates in alternative control modes including a flow verification control mode and a flow ratio control mode. In the flow verification control mode, the controller calculates a calibrated value for a reference volume using measurements from a mass flow meter in the hybrid distribution channel, then calculates a target channel calibration value for the mass flow meter in the target distribution channel. In the flow ratio control mode, the controller controls each of the distribution channels, including the hybrid channel, according to a respective flow ratio setpoint for each distribution channel.

20 Claims, 11 Drawing Sheets

FLOW RATIO CONTROLLER SYSTEM OPERATING IN ALTERNATIVE CONTROL MODES

BACKGROUND

In the field of semiconductor manufacturing, achieving consistency in the production of semiconductor devices is a challenge. Manufacturers frequently encounter difficulties in creating repeatable and reproducible semiconductor devices due to variations in the processing parameters of each process chamber. These variations can include differences in flow rates, temperature control, chamber surface and volume conditions, plasma frequency and density, and geometric factors. To address this issue, manufacturers have developed a practice where they establish a standard or "golden chamber"-a process chamber which is used to calibrate other process chambers in the same manufacturing setup.

This calibration process involves adjusting various process variables to align the performance of multiple process chambers. The most common method employed for this purpose involves recalibrating or fine-tuning the process recipe setpoints of mass flow controllers (MFCs).

A prevalent practice among some manufacturers is to run gas flow into a single, closed, evacuated process chamber and measure the rate-of-rise (ROR) of pressure inside it. By incorporating temperature measurements and the rate of pressure rise, and applying the Ideal Gas Law equation, the mass flow can be calculated. This practice is known as "chamber rate of rise". However, this method introduces errors due to inaccuracies in the known volume of each process chamber or slight differences in chamber volumes, thereby hindering the ability to match processes across different process chambers.

Another conventional approach involves the use of a common flow verification system, which employs various elemental flow metering or measurement concepts. In this system, the MFCs from all chambers flow into a centrally located flow verifier. This method is generally more effective than the "chamber rate of rise" method for chamber matching, as it eliminates the variation caused by different chamber volumes. However, this central verification system has several disadvantages. These include the significant addition of hardware, plumbing, and associated costs; the long time of flight (ToF) of gas from MFCs to the flow verification system due to extended plumbing distances; and the limitation that only one MFC can flow to the verification system at a time, necessitating a serial or sequential approach to MFC verification and warping. These factors contribute to lengthy system start-up and qualification times, as well as increased costs for manufacturers.

SUMMARY

To address the above issues, a flow ratio controller system is provided, comprising an inlet configured to receive a total inlet fluid flow, a plurality of distribution channels fluidically connected to the inlet and arranged in parallel in a branching flow path downstream of the inlet. Each of the plurality of distribution channels is provided with a respective flow control valve and configured to carry a respective portion of the total inlet fluid flow. The plurality of distribution channels includes a hybrid distribution channel. A controller is operatively coupled to each of the plurality of distribution channels. The controller is configured to selectively operate in alternative control modes including a flow verification control mode and a flow ratio control mode. In the flow verification control mode, the controller is configured to perform a first rate-of-pressure-change test on a first target flow path that extends from the inlet through a reference volume to the hybrid distribution channel, using measurements from a mass flow meter in the hybrid distribution channel, to thereby calculate a calibrated value for the reference volume. Further, in the flow verification control mode, the controller is also configured to perform verification of a flow rate value measured by a mass flow meter in a target distribution channel of the plurality of distribution channels other than the hybrid distribution channel, by conducting a second rate-of-pressure-change test on a second target flow path from the inlet through the reference volume to the target distribution channel, using the calibrated value for the reference volume, to thereby calculate a target channel calibration value for the mass flow meter in the target distribution channel. In the flow verification mode, the controller is further configured to calibrate the mass flow meter in the target distribution channel using the target channel calibration value. In the flow ratio control mode, the controller is configured to control each of the plurality of distribution channels including the hybrid distribution channel, according to a respective flow ratio setpoint for each distribution channel.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1A:
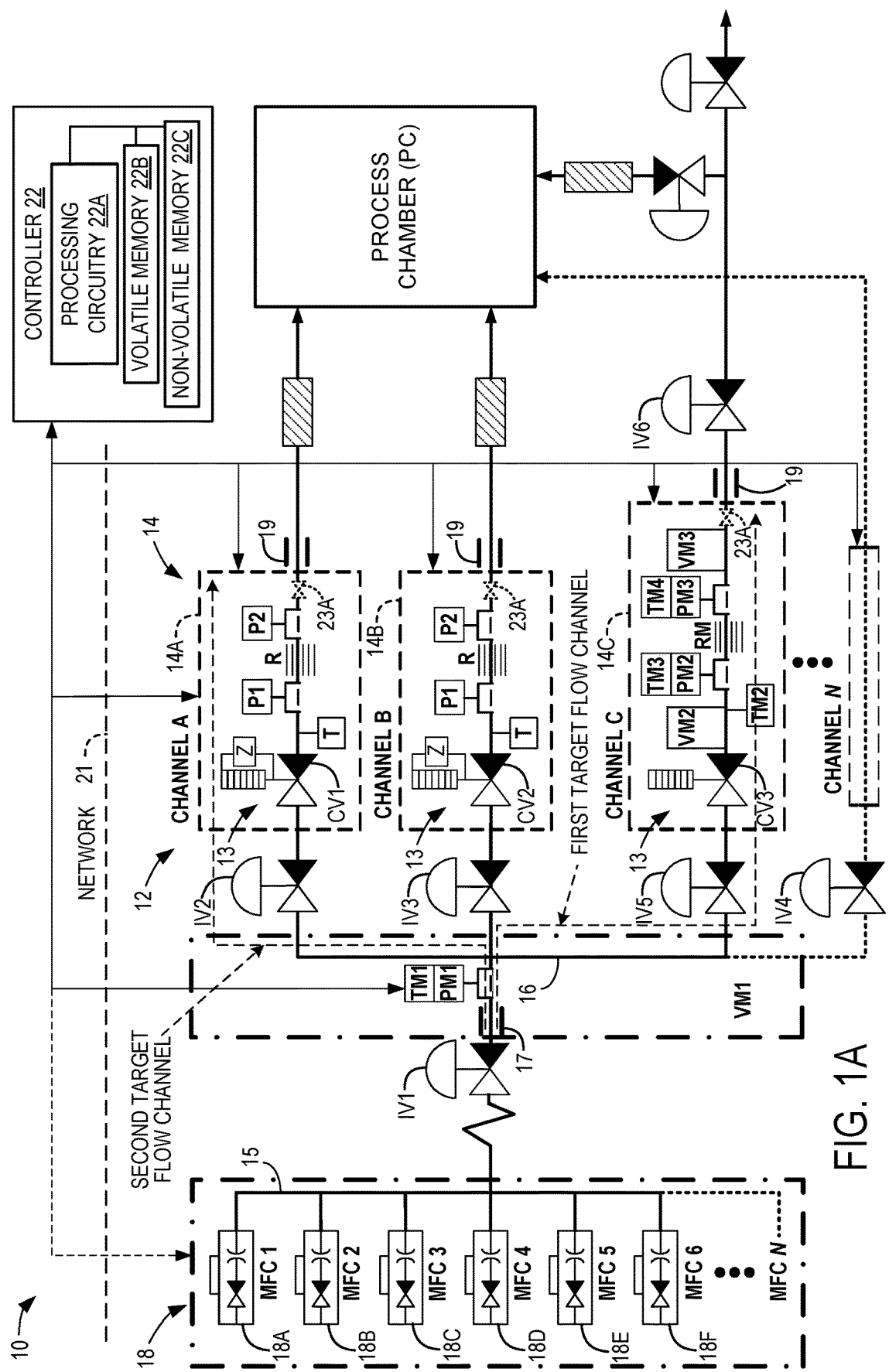
FIG. 1A is a schematic view showing a flow ratio controller system according to an example configuration of the present disclosure.

In view of the above issues, referring to FIG. 1, a flow ratio controller system 10 is provided, shown in a first example configuration. The flow ratio controller system 10 includes a flow splitter subsystem 12 and an inlet 17 which is configured to receive an upstream total inlet fluid flow which subsequently flows through the flow splitter subsystem 12. For example, the inlet 17 may receive an upstream flow of fluid from a collective first manifold 15 which is configured to collect flow from outlets of one or more inlet channels 18. In the example of FIG. 1, the flow from each of the inlet channels 18A-F is collected in the first manifold 15, which subsequently delivers the combined flows to the inlet 17 of the flow splitter subsystem 12 of the flow ratio controller system 10. A respective upstream mass flow controller MFC 1 to MFC N may be fluidically connected upstream of the inlet 17 on each of the one or more inlet channels 18. It will be appreciated that the first manifold 15, like the second manifold 16 described below, may be formed of manifold blocks with fluid paths formed therein, or alternatively may be formed in another form such as via one or more pipes with appropriate fluid paths formed therein.

The flow ratio controller system 10 may be configured as a gas delivery apparatus which may be enclosed within a housing. The fluid lines described herein may be implemented using flow blocks, piping, or alternative flow passage structures. It will be appreciated that, while six mass flow controllers MFC 1 to MFC 6 are depicted in FIG. 1, their number is not particularly limited, and may be fewer or greater than six, as indicated by the notation MFC N.

The inlet 17 is configured to receive a total inlet fluid flow from the one or more inlet channels 18. The flow splitter subsystem 12 of the flow ratio controller system 10 is further configured with a plurality of distribution channels 14, including a hybrid distribution channel 14C, which flow gas into a process chamber PC, in which processes such as deposition and etching are performed during semiconductor manufacturing. The hybrid distribution channel 14C is used in two different ways (i.e., for verification of a reference volume and for carrying a portion of the total flow), depending on the mode of operation, and for this reason is referred to as a "hybrid" channel herein. The distribution channels 14 are fluidically connected to the inlet 17 which is formed on an upstream side of a downstream manifold 16. The distribution channels 14 are arranged in parallel in the downstream manifold 16 in a branching flow path downstream of the inlet 17, leading to respective outlets 19 which direct fluid flow into the process chamber PC. Each of the plurality of distribution channels 14 is provided with a respective variable flow control valve CV1-CV3 and is configured to carry a respective portion of the total inlet fluid flow entering the flow splitter subsystem 12. The variable flow control valve CV1-CV3 is integrated within a channel-specific flow controller 13, which could measure either mass or volumetric flow, and is positioned on each distribution channel 14.

It will be appreciated that, while three distribution channels 14 are depicted in FIG. 1, their number is not particularly limited, and may be fewer or greater than three, as indicated by the notation Channel N. For example, Channel N may be an additional distribution channel in the branching flow path downstream of the inlet 17. In some configurations, channel N may be provisioned without a flow control valve and configured to carry a respective portion of the total inlet fluid flow.

Figure 1B:
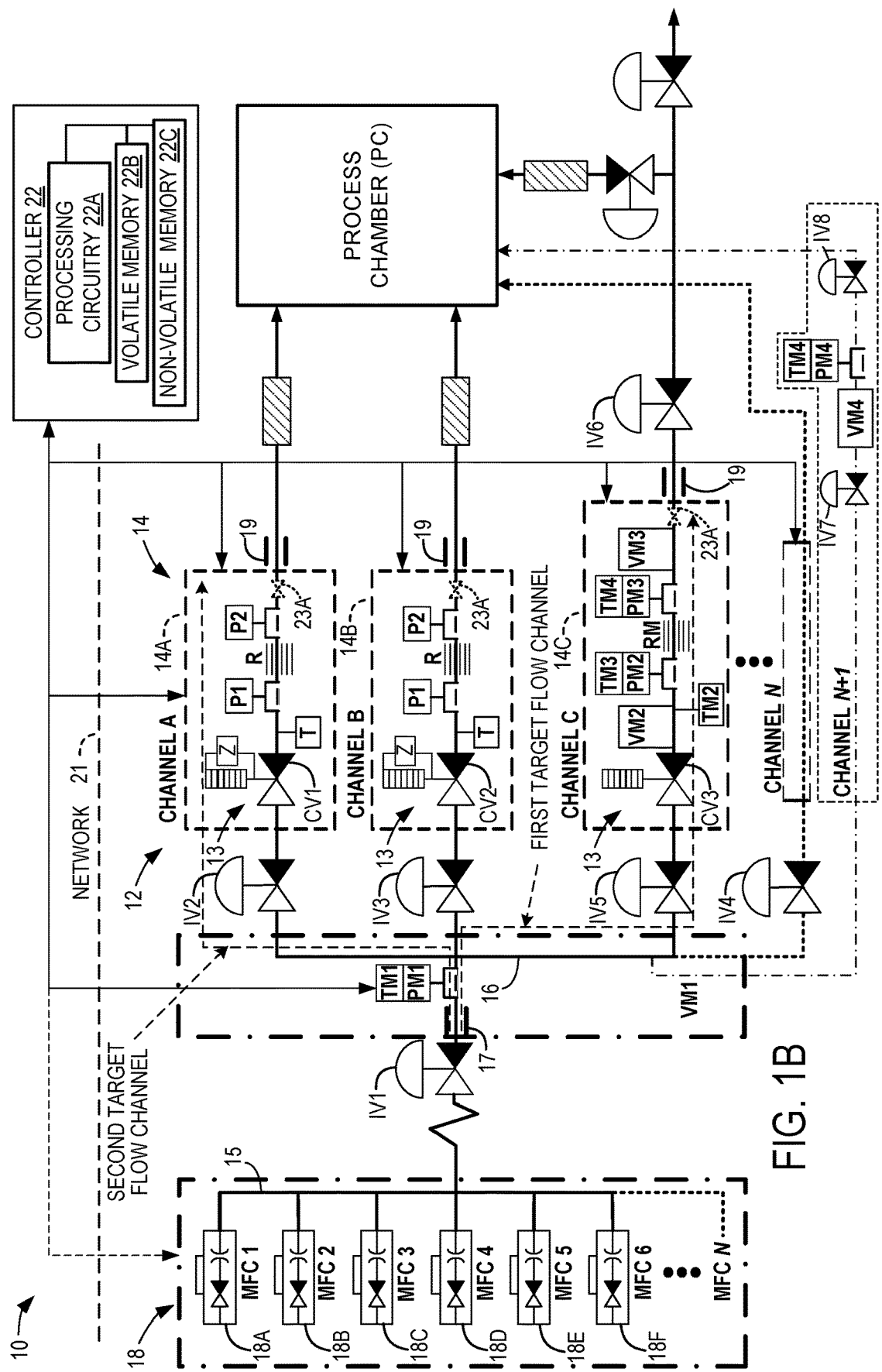
FIG. 1B is a schematic view showing a flow ratio controller system according to another example configuration of the present disclosure.

As shown in FIG. 1B, the distribution channels 14 may also include a high flow distribution channel N+1 that branches from the manifold from a point upstream of a branch point for the hybrid distribution channel 14C and that includes a downstream reference volume VM4 with isolation valves IV7, IV8 on an upstream side and a downstream side of the downstream reference volume VM4. A metrology temperature sensor TM4 and a metrology pressure sensor PM4 may be provided in the high flow distribution channel N+1. The configuration of FIG. 1B is otherwise the same as FIG. 1A, and further description of FIG. 1B will be omitted for the sake of brevity.

Returning to FIG. 1A, at the entry point into the flow splitter subsystem 12, a primary isolation valve IV1 is situated upstream of inlet 17. Additional isolation valves, IV2, IV3, and IV5, are placed just upstream of their corresponding flow control valves, CV1, CV2, and CV3 of distribution channels 14A-C, respectively. Flow ratio control channel 14A has isolation valve IV2 positioned upstream of channel 14A, isolation valve IV3 is positioned immediately upstream of channel 14B, and isolation valve IV5 is positioned immediately upstream of hybrid channel 14C.

Each distribution channel 14A, 14B that is not a hybrid distribution channel 14C may include a valve position sensor Z configured to measure an opening degree of the flow control valve CV1, CV2, a temperature sensor T configured to measure the temperature of fluid in the distribution channel 14, a fixed geometry flow restrictor R configured to restrict flow of the fluid, an upstream pressure sensor P1 configured to measure a pressure of the fluid upstream of the restrictor R, and a downstream pressure sensor P2 configured to measure a pressure of the fluid downstream of the restrictor R, arranged in this order in a downstream direction of the flow path along each distribution channel 14. The flow control valves CV1-CV3 are typically upstream of the flow restrictor R, but may alternatively be downstream of the flow restrictor R as shown in dashed lines at 23A. Each distribution channel 14 is configured with a respective outlet 19 of the flow splitter subsystem 12. The upstream pressure sensors P1 and the downstream pressure sensors P2 may be configured as diaphragm-isolated pressure sensors.

The hybrid distribution channel 14C includes a pair of metrology pressure sensors PM2, PM3 and a pair of metrology temperature sensors TM3, TM4 positioned on each side of a restrictor RM. In this example, the hybrid distribution channel 14C includes a sequence of components including flow control valve CV3, a first internal volume VM2, a metrology temperature sensor TM2 configured to measure a temperature of the first internal volume VM2, the upstream metrology temperature sensor TM3 and the upstream metrology pressure sensor PM2, the restrictor RM, the downstream metrology temperature sensor TM4 and the downstream metrology pressure sensor PM3, and a second internal volume VM3, aligned in this order in a downstream flow direction of the hybrid distribution channel 14C.

An accuracy of the upstream metrology pressure sensor PM2 and the downstream metrology pressure sensor PM3 may be an accuracy value within ±0.1% of FS (full scale). A temperature coefficient of the upstream metrology temperature sensor TM3 and the downstream metrology temperature sensor TM4 may be an accuracy value within ±0.02% of FS/° C. (full scale). The upstream metrology pressure sensor PM2 and the downstream metrology pressure sensor PM3 may be MEMS (micro-electromechanical systems) oscillating type pressure sensors. A diameter of a channel in the restrictor RM may be less than 50 micrometers. A length of the channel in the restrictor RM may be more than 10 millimeters and less than 50 millimeters. The restrictor RM may comprise ceramic material, and the internal flow channel within the restrictor RM may be cut and shaped within the ceramic material to precisely adjust the length and volume dimensions of the internal flow channel within the restrictor RM.

The flow ratio controller system 10 further includes a controller 22 operatively coupled to the respective variable flow control valves CV1-CV3 of each of the plurality of distribution channels 14 to control the respective variable flow control valves CV1-CV3 in a feedback loop. The variable flow control valves CV1-CV3 may be proportional flow control valves, for example.

The controller 22 is configured to selectively operate in alternative control modes including a flow verification control mode and a flow ratio control mode. In the flow verification control mode, the controller 22 is configured to perform a first rate-of-pressure-change test on a first target flow path that extends from the inlet 17 through a reference volume VM1 to the hybrid distribution channel 14C, using measurements from a mass flow meter in the hybrid distribution channel 14C, to thereby calculate a calibrated value for the reference volume VM1. In the flow verification control mode, the controller 22 is further configured to perform verification of a flow rate value measured by a mass flow meter in a target distribution channel (14A, for example) of the plurality of distribution channels 14A, 14B other than the hybrid distribution channel 14C, by conducting a second rate-of-pressure-change test on a second target flow path from the inlet 17 through the reference volume VM1 to the target distribution channel (14A, for example), using measurements from a temperature sensor and a pressure sensor in the target distribution channel (14A, for example) and the calibrated value for the reference volume VM1, to thereby calculate a target channel calibration value for the mass flow meter in the target distribution channel 14C.

In the flow ratio control mode, the controller 22 is configured to control each of the plurality of distribution channels 14 including the hybrid distribution channel 14C and the target distribution channel (14A, for example) with the calibrated mass flow meter, according to a respective flow ratio setpoint for each distribution channel 14. The mass flow meter in the hybrid distribution channel 14C may be embodied as the pair of metrology pressure sensors PM2, PM3 and the pair of metrology temperature sensors TM3, TM4 positioned on each side of the restrictor RM, for example.

The controller 22 may be configured to perform verification of the flow in one of the inlet channels 18 or in one or more of the distribution channels 14 at least in part by conducting a rate of pressure change test, such as a rate of pressure rise test (ROR test) or a rate of pressure fall test (ROF test), using the Ideal Gas Law (PV=nRT) and a reference volume provided on the branching flow path downstream of the inlet 17.

The reference volume may be an upstream reference volume VM1 provided in the downstream manifold 16 on the branching flow path downstream of the inlet 17 and upstream of a restrictor RM of a mass flow meter situated in the hybrid distribution channel 14C. In this implementation, the upstream metrology pressure sensor PM1 and the upstream metrology temperature sensor TM1 are positioned in the upstream reference volume VM1 and operatively coupled to the controller 22. The upstream reference volume VM1 may be defined as a segment of the flow path spanning from the primary isolation valve IV1 to the downstream valves, IV2, IV3, and IV5.

In another implementation, the reference volume may be a downstream reference volume VM3 that is provided on the branching flow path downstream of a restrictor RM of a mass flow control device situated in the hybrid distribution channel 14C.

Alternatively, the reference volume may be an intermediate reference volume VM2 that is provided on the branching flow path downstream of the inlet 17 and upstream of a restrictor RM of a mass flow meter situated in the hybrid distribution channel 14C. In this implementation, the metrology temperature sensor TM2 is positioned in the intermediate reference volume VM2.

The downstream manifold 16 includes an upstream metrology pressure sensor PM1 and an upstream metrology temperature sensor TM1 positioned in the upstream reference volume VM1 and operatively coupled to the controller 22.

The controller 22 includes processing circuitry 22A, volatile memory 22B such as Random Access Memory (RAM), and non-volatile memory 22C such as Read Only Memory (ROM), FLASH memory, hard drive, etc. Non-volatile memory 22C stores program instructions that when executed by the processing circuitry 22A using portions of volatile memory 22B, cause the processing circuitry 22A to instruct the flow splitter subsystem 12 accordingly to achieve the implement the control processes described herein. In some implementations, the controller 22 may be configured as a System on Module (SOM). The processing circuitry 22A may be a central processing unit (CPU), application-specific integrated circuit (ASIC), field-programmable gate array (FPGA), or other type of microprocessor, and may be a multi-core processor, for example. The controller 22 may be operatively coupled to the flow splitter subsystem 12 via a network 21 or direct data connection, and the controller 22 may optionally be operatively coupled to MFC 1-N of the inlet channels 18 via the network 21 or direct data connection.

In some embodiments, it will be appreciated that a channel-specific control microprocessor can be included within each distribution channel, including memory and processor functionality used to control the flow controller positioned on that channel. It will be appreciated that the microprocessor for one of the channels can be programmed to implement the functions of controller 22. When such a configuration is employed, the channel having the microprocessor configured to act as the controller 22 is referred to as a master channel.

In one example, in which the flow splitter subsystem 12 comprises flow ratio control channels 14A, 14B, and hybrid distribution channel 14C, flow verification of the flow splitter subsystem 12 is performed by closing the isolation valves IV2, IV3, and IV4, while leaving isolation valve IV5 open, allowing fluid to pass solely through the hybrid distribution channel 14C, wherein the flow rate is measured. The calculation of the flow rate for flow rate control or verification may involve the use of a digital twin model of the restrictor RM which incorporates flow mechanics equations taking into account the precise geometry of the internal flow channel within the restrictor RM as well as the properties of the fluid flowing through the restrictor RM.

To perform the first rate-of-pressure-change test, the controller 22 is configured to control the valves along the branching flow path to establish the first target flow path. For calibration purposes, this may be accomplished by closing the main isolation valve IV1 along with the downstream valves IV2, IV3, and IV5, and subsequently opening valves IV5 and IV6, which is downstream of channel 14C. Then, the controller 22 establishes controlled compression or decompression of the reference volume VM1 using a calibrated total inlet flow having a first predetermined mass flow rate value. To achieve this, control valves CV3, RM of the target distribution channel 14C may be adjusted to achieve controlled depressurization of the upstream reference volume VM1.

Then, the controller 22 measures a temperature change and a pressure change in the hybrid distribution channel 14C during the controlled compression or decompression using a temperature sensor and a pressure sensor in the hybrid distribution channel 14C, respectively. To measure the temperature change and measure the pressure change, the controller 22 may measure an initial pressure and initial temperature and a later pressure and later temperature in the hybrid distribution channel 14C as a result of the controlled compression or decompression. For example, the hybrid distribution channel 14C may be employed to measure pressure decay (the rate of pressure change or drop) within VM1, using signals from the upstream metrology pressure sensor PM1 and the upstream metrology temperature sensor TM1 positioned in the reference volume VM1 during the controlled depressurization. Temperature sensor TM1 provides concurrent temperature measurements of the first upstream volume VM1, which, in conjunction with the gas law rate of change (ROC) calculations, allows for an assessment of the volume VM1 by comparing changes in mass flow as indicated by the hybrid distribution channel 14C against the pressure and temperature values measured by the pressure sensor PM1 and temperature sensor TM1, respectively.

Then, the controller 22 calculates a calibrated value for the reference volume based on the measured temperature change, the measured pressure change, the first predetermined mass flow rate value, and a gas constant. The calibration value for the upstream reference volume VM1 may be calculated based on the measured pressure decay, and the calculated calibration value may be subsequently stored in non-volatile memory 22C. The calibration value for the reference volume VM1 may also be computed using the ideal gas law (PV=nRT), using values for the measured initial pressure, measured initial temperature, measured later pressure, measured later temperature, the gas constant, and the mass flow rate of the calibrated total inlet flow.

The calibrated first upstream volume VM1 is subsequently used as an established parameter and benchmark for subsequent evaluations of the flow dynamics within the other target distribution channels 14A, 14B. The process involves a series of steps to ensure that the flow characteristics of these channels 14A, 14B are within the desired specifications for stable and reliable performance.

To perform verification of the flow rate value measured by the mass flow meter in the target distribution channel (14A, for example) in the flow verification control mode, the controller 22 is further configured to control valves along the branching flow path to establish the second target flow path between the inlet and only the target distribution channel (14A, for example), the second target flow path including the reference volume VM1. This may be achieved by closing the main isolation valve IV1. Then, the controller 22 establishes controlled compression or decompression of the reference volume VM1 while the second target flow path is established using a calibrated total inlet flow having a second predetermined mass flow rate value. Pressurization may be achieved by closing the main isolation valve IV1, effectively sealing the system to prevent external influences. With the system thus isolated, the pressurized volume VM1 becomes a static environment where any variations can be attributed solely to the behavior of the channels being tested.

The controller 22 measures a pressure change and a temperature change using the temperature sensor and the pressure sensor in the target distribution channel (14A, for example) during the controlled compression or decompression while the second target flow path is established. In this example, the downstream isolation valves IV2 or IV3, depending on the channel being calibrated (14A or 14B), may be methodically opened while the other channels remain isolated. This targeted approach allows for an isolated assessment of each channel's flow characteristics without the interference of parallel flow paths.

When the channel being calibrated is channel 14A, control valves CV1, R of the target distribution channel 14A are controlled to achieve controlled depressurization of the upstream reference volume VM1 through the target distribution channel 14A. The pressure within the first upstream volume VM1 begins to decrease as the isolation valve IV2 is opened to allow fluid to flow through channel 14A. Pressure decay is measured using signals from an upstream metrology pressure sensor P1 and an upstream metrology temperature sensor P2 positioned in the reference volume R during the controlled depressurization in a ROF test.

It will be appreciated that the calibration of channel 14B and others is performed similarly to channel 14A. The decay in the pressure of the first upstream volume VM1 provides information about the properties of the channel 14A, including structural characteristics of the channel 14A including cross-sectional area, surface roughness, and the presence of any flow restrictors. The rate of pressure fall of the first upstream volume VM1 is recorded throughout the pressure decay process.

Then, the controller 22 calculates a rate-of-change-based flow rate through the target distribution channel 14A based on the measured pressure change, the measured temperature change, the calibration value for the reference volume VM1, and the second predetermined mass flow rate value. This can be accomplished by measuring the temperature at TM1 and pressure at PM1 at two points in time during the rate-of-change test, for example, and computing a mass flow rate using the ideal gas law as described above, using the calibration value for the reference volume for VM1.

The controller calculates a restrictor-based flow rate through the target distribution channel based upon restrictor dimensions of a restrictor R in the target distribution channel 14A and the second predetermined mass flow rate value. This may be accomplished, for example, by a mass flow meter on the target distribution channel 14A measuring the mass flow rate across the restrictor in the target distribution channel 14A, using the measurements from pressure sensors P1 and P2 and temperature sensor T, for example. Then a target channel calibration value is calculated based on a comparison of the calculated rate-of-change-based flow rate and the calculated restrictor-based flow rate. The calculated target channel calibration value is subsequently stored in non-volatile memory 22C. While this technique has been described using channel A 14A as an example target distribution channel, it will be appreciated that the technique could be applied to any of channels 1-N in FIG. 1A, and also channel N+1 in FIG. 1B.

The flow verification control mode may also be performed by the controller 22 to perform verification of a mass flow rate value measured by a target mass flow controller (MFC 1, for example). To perform flow verification of the target mass flow controller, a target mass flow controller calibration value is calculated and used to calibrate the target mass flow controller in the target inlet channel.

The fidelity of the performance of the target distribution channel 14A may be determined by comparing the observed rate of pressure decay to the expected behavior as predicted by the flow restrictor model. Discrepancies between the observed and expected rates can signal issues such as clogging, wear, or defects within the channel or restrictor R, necessitating further investigation or adjustment.

The first upstream volume VM1 may be calibrated in a chamber matching process. In such a process, the first upstream volume VM1 may be calibrated using the hybrid distribution channel 14C or independently via another calibration method, such as a gravimetric calibration method. When the calibration is performed using the hybrid distribution channel 14C, the first upstream volume VM1 may be calibrated independently. Accordingly, the first upstream volume VM1 becomes the golden chamber to be matched by other chambers in the distribution channels 14 downstream of the inlet 17 and the inlet channels 18 upstream of the inlet 17, so that the internal volumes of these channels 14, 18 can be calibrated using the first upstream volume VM1. For example, a flow rate calibration value for an upstream mass flow controller MFC 1 on an upstream channel 18A fluidically connected to the inlet 17 can be calculated using the calibration value for the upstream reference volume VM1. Therefore, in the flow verification control mode, the controller 22 may be configured to perform verification of flow in a respective mass flow controller MFC 1. Accordingly, the reference volumes VM1, VM2, and VM3 may be used as non-drift references that can be cross-checked with other flow references and mass flow controllers.

Figure 2:
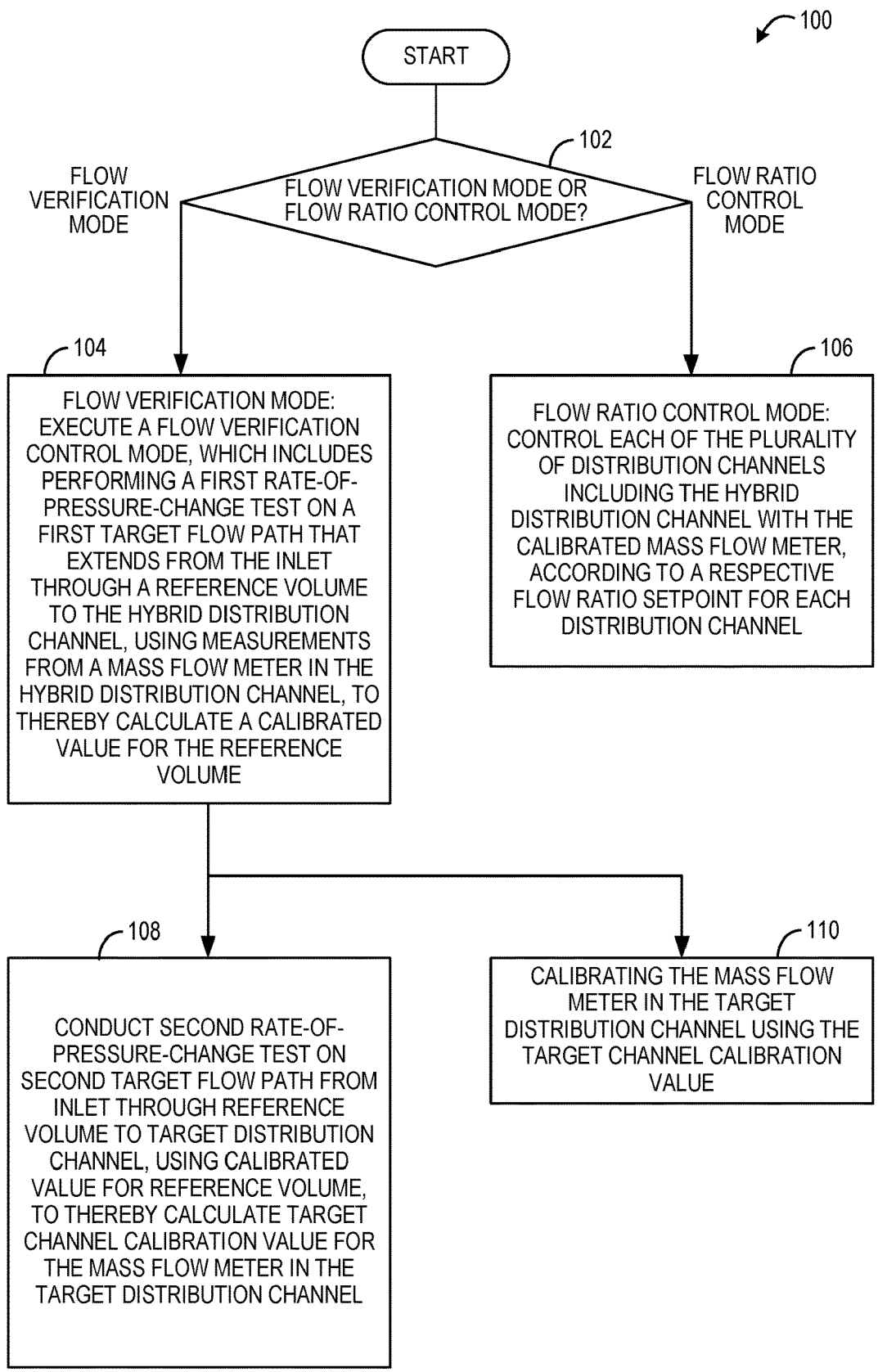
FIG. 2 shows a flowchart for a first method of controlling the flow ratio controller systems of FIGS. 1A and 1B.

FIG. 2 is a flowchart of a first method 100 for use with a flow ratio controller including an inlet configured to receive a total inlet fluid flow, and a plurality of distribution channels fluidically connected to the inlet and arranged in parallel in a branching flow path downstream of the inlet, each of the plurality of distribution channels being provided with respective valves and being configured to carry a respective portion of the total inlet fluid flow, the plurality of distribution channels including a hybrid distribution channel. The first method 100 may be implemented on the controller system 10 illustrated in FIG. 1 above, which include processing circuitry and associated memory of a controller configured to selectively operate in alternative control modes including a flow verification control mode and a flow ratio control mode. Alternatively, other suitable computing hardware and software may be utilized.

At 102, the method includes determining whether to operate in a flow verification control mode or a flow ratio control mode. This can be determined based on control inputs from a controller or user inputs, for example. At 104, the method includes executing a flow verification control mode, which includes performing a first rate-of-pressure-change test on a first target flow path that extends from the inlet through a reference volume to the hybrid distribution channel, using measurements from a mass flow meter in the hybrid distribution channel, to thereby calculate a calibrated value for the reference volume. At 108, the method includes executing the flow verification control mode, which includes performing verification of a flow rate value measured by a mass flow meter in a target distribution channel of the plurality of distribution channels other than the hybrid distribution channel, by conducting a second rate-of-pressure-change test on a second target flow path from the inlet through the reference volume to the target distribution channel, using the calibrated value for the reference volume, to thereby calculate a target channel calibration value for the mass flow meter in the target distribution channel. In addition to the calibrated value, measurements from a temperature sensor and pressure sensor in the target distribution channel may be used to calculate the target channel calibration value at 108. At 110, the method includes executing the flow verification control mode, which includes calibrating the mass flow meter in the target distribution channel using the target channel calibration value.

At 106, the method includes executing a flow ratio control mode, in which each of the plurality of distribution channels including the hybrid distribution channel, is controlled according to a respective flow ratio setpoint for each distribution channel. Typically, this control ratio control mode is executed after calibration using the calibrated mass flow meter of the target distribution channel. In some examples, all distribution channels may be calibrated in this manner prior to execution of the flow ratio control mode.

Figure 3:
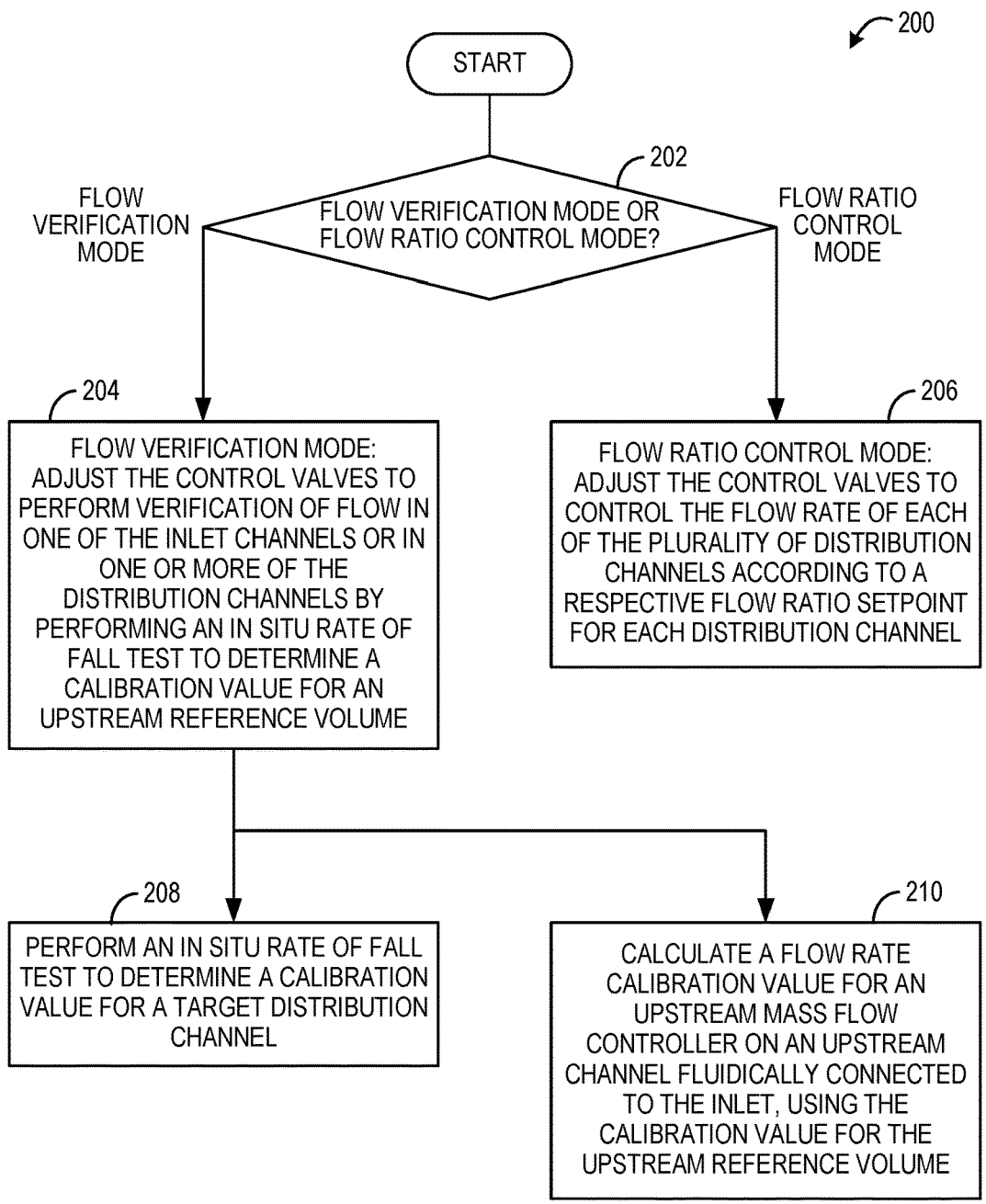
FIG. 3 shows a flowchart for a second method of controlling the flow ratio controller systems of FIGS. 1A and 1B.

FIG. 3 is a flowchart of a second method 200 of controlling a flow ratio controller system having a plurality of distribution channels fluidically connected to an inlet of a manifold and arranged in parallel in a branching flow path downstream of the inlet. Each of the plurality of distribution channels is provided with a respective control valve and being configured to carry a respective portion of a total inlet fluid flow, and the plurality of distribution channels include a hybrid distribution channel. The second method 200 may be implemented on the controller system 10 illustrated in FIG. 1 above, which includes processing circuitry and associated memory of a controller configured to selectively operate in alternative control modes including a flow verification control mode and a flow ratio control mode. Alternatively, other suitable computing hardware and software may be utilized.

At 202, the method includes determining whether to operate in a flow verification control mode or a flow ratio control mode. At 204, the method includes, in a flow verification control mode, adjusting the control valves to perform verification of flow in one of the inlet channels or in one or more of the distribution channels by performing an in-situ rate of fall test to determine a calibration value for an upstream reference volume. At 206, the method includes, in a flow ratio control mode, adjusting the control valves to control the flow rate of each of the plurality of distribution channels according to a respective flow ratio setpoint for each distribution channel.

At 208, the method includes performing an in-situ rate of fall test to determine a calibration value for a target distribution channel. At step 210, the method includes calculating a flow rate calibration value for an upstream mass flow controller on an upstream channel fluidically connected to the inlet, using the calibration value for the upstream reference volume.

Figure 4:
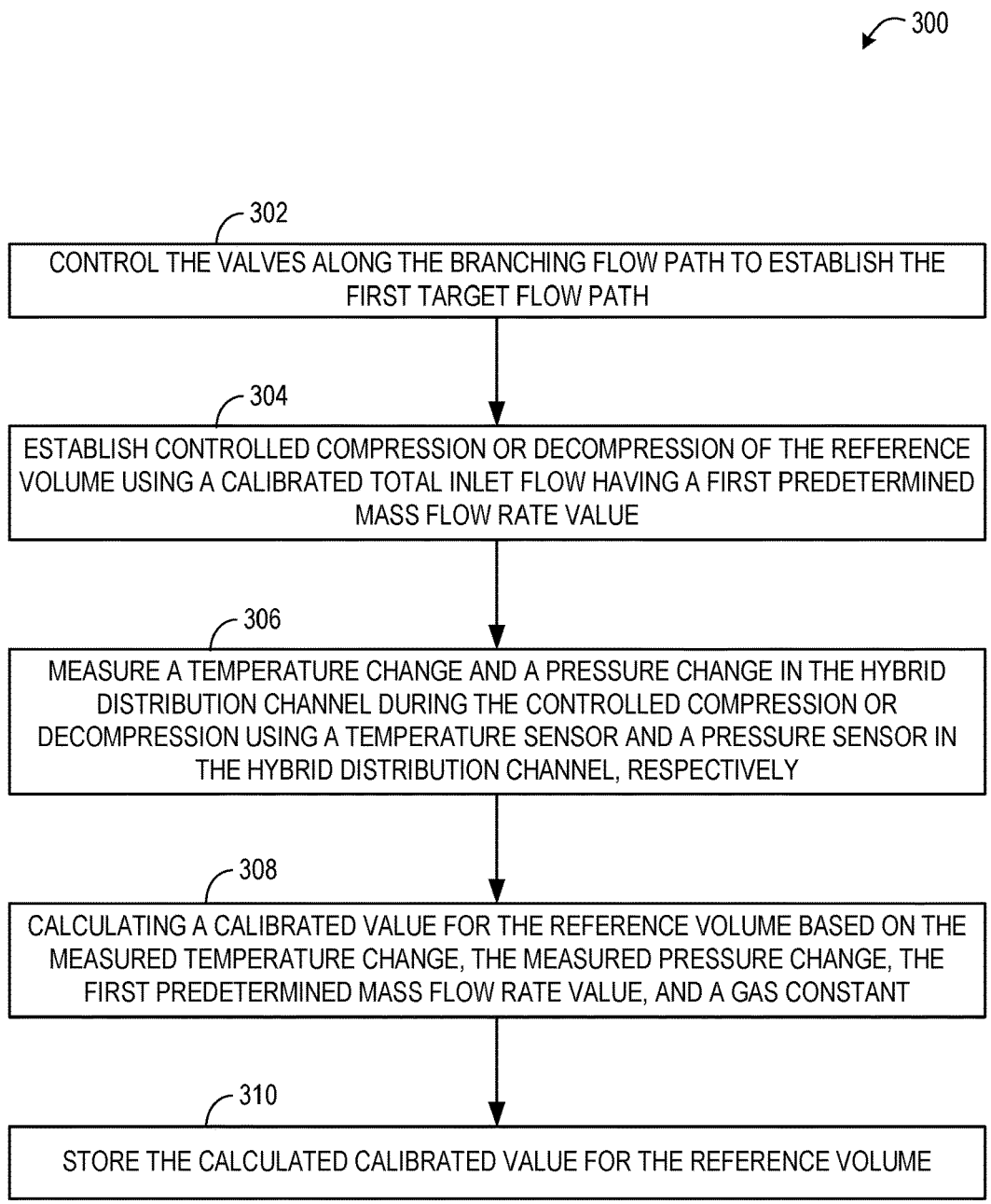
FIG. 4 shows a flowchart for a third method illustrating the performance of the first rate-of-pressure-change test of the first method as described in FIG. 2.

FIG. 4 is a flowchart of a third method 300 illustrating the performance of the first rate-of-pressure-change test as described in 104 of the first method 100.

At 302, the method includes controlling the valves along the branching flow path to establish the first target flow path. At 304, the method includes establishing controlled compression or decompression of the reference volume using a calibrated total inlet flow having a first predetermined mass flow rate value. At 306, the method includes measuring a temperature change and a pressure change in the hybrid distribution channel during the controlled compression or decompression using a temperature sensor and a pressure sensor in the hybrid distribution channel, respectively. At 308, the method includes calculating a calibrated value for the reference volume based on the measured temperature change, the measured pressure change, the first predetermined mass flow rate value, and a gas constant. At 310, the method includes storing the calculated calibrated value for the reference volume.

Figure 5:
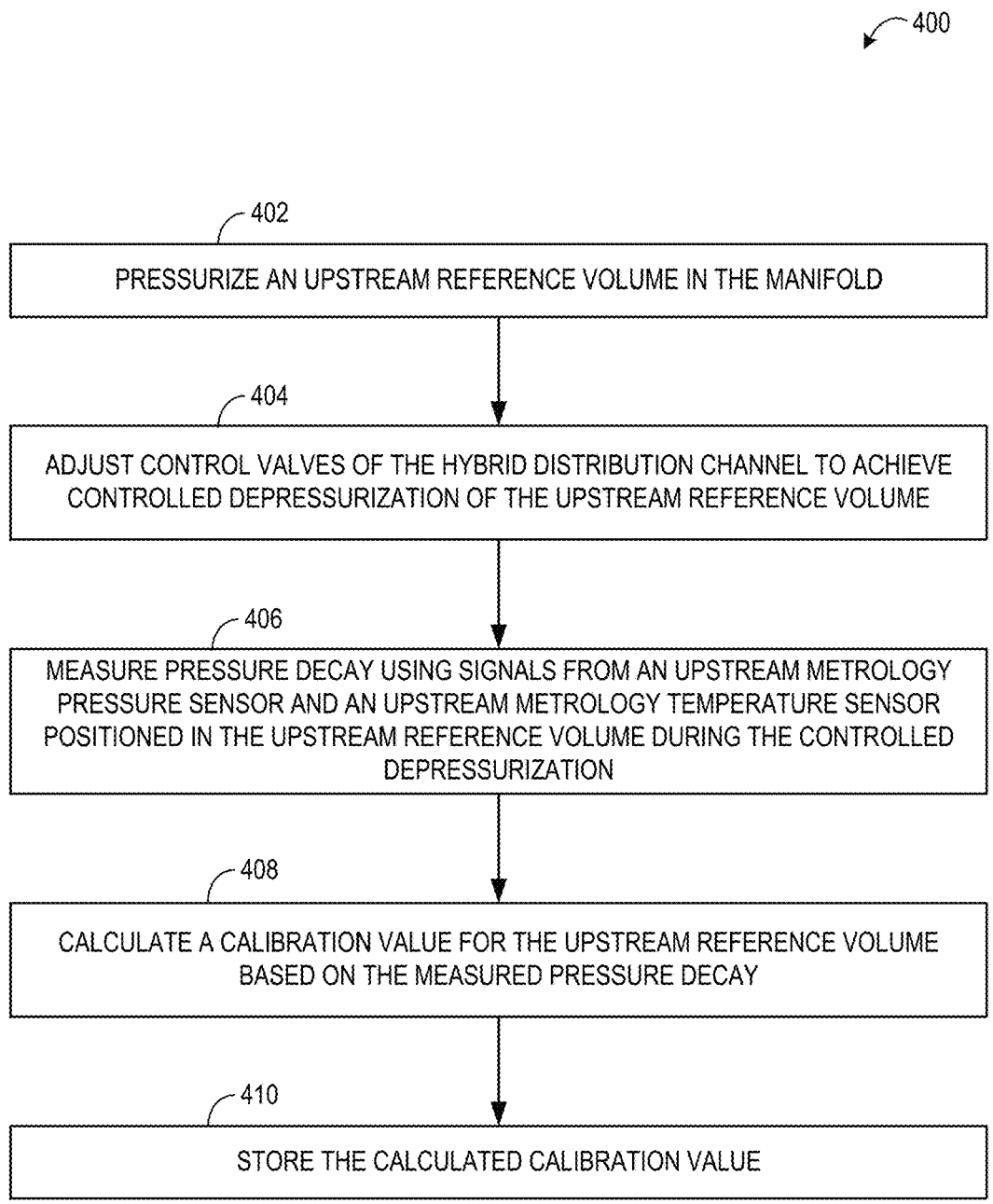
FIG. 5 shows a flowchart for a fourth method illustrating the performance of an in-situ rate of fall test to determine a calibration value for an upstream reference volume in the system of FIG. 1.

FIG. 5 is a flowchart of a fourth method 400 illustrating the performance of an in-situ rate of fall test to determine a calibration value for an upstream reference volume, as described in 204 of the second method 200.

At 402, the method includes pressurizing an upstream reference volume in the manifold. At 404, the method includes adjusting control valves of the hybrid distribution channel to achieve controlled depressurization of the upstream reference volume. At 406, the method includes measuring pressure decay in a ROF test using signals from an upstream metrology pressure sensor and an upstream metrology temperature sensor positioned in the upstream reference volume during the controlled depressurization. At 408, the method includes calculating a calibration value for the upstream reference volume based on the measured pressure decay. At 410, the method includes storing the calculated calibration value.

Figure 6:
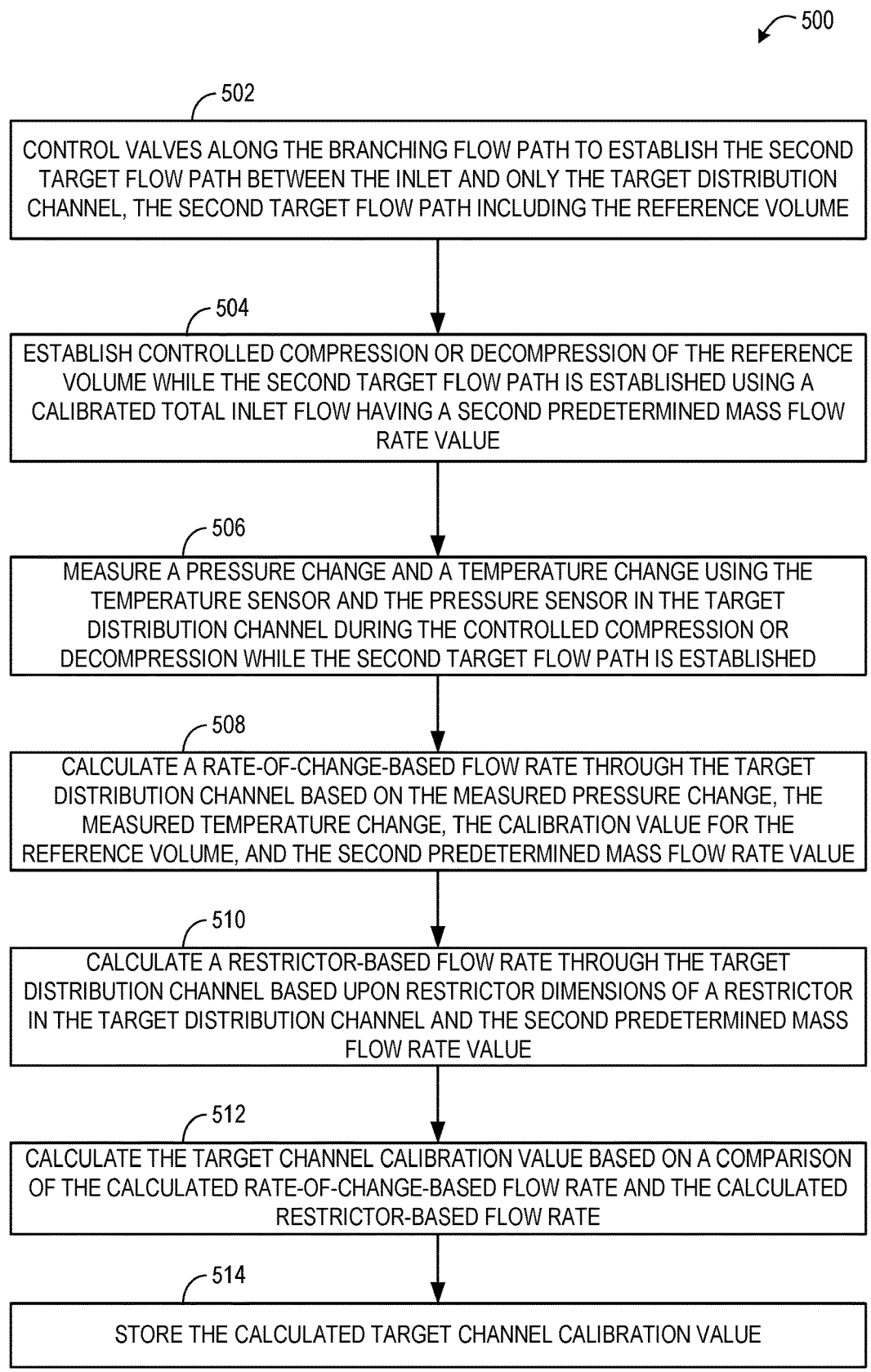
FIG. 6 shows a flowchart of a fifth method illustrating the verification of the flow rate value measured by the mass flow meter in the target distribution channel in the flow verification control mode of the first method 100 as described in FIG. 2.

FIG. 6 is a flowchart of a fifth method 500 illustrating the verification of the flow rate value measured by the mass flow meter in the target distribution channel in the flow verification control mode as described in 108 of the first method 100.

At 502, the method includes controlling valves along the branching flow path to establish the second target flow path between the inlet and only the target distribution channel, the second target flow path including the reference volume. At 504, the method includes establishing controlled compression or decompression of the reference volume while the second target flow path is established using a calibrated total inlet flow having a second predetermined mass flow rate value. At 506, the method includes measuring a pressure change and a temperature change using the temperature sensor and the pressure sensor in the target distribution channel during the controlled compression or decompression while the second target flow path is established. At 508, the method includes calculating a rate-of-change-based flow rate through the target distribution channel based on the measured pressure change, the measured temperature change, the calibration value for the reference volume, and the second predetermined mass flow rate value. At 510, the method includes calculating a restrictor-based flow rate through the target distribution channel based upon restrictor dimensions of a restrictor in the target distribution channel and the second predetermined mass flow rate value. At 512, the method includes calculating the target channel calibration value based on a comparison of the calculated rate-of-change-based flow rate and the calculated restrictor-based flow rate. At 514, the method includes storing the calculated target channel calibration value.

Figure 7:
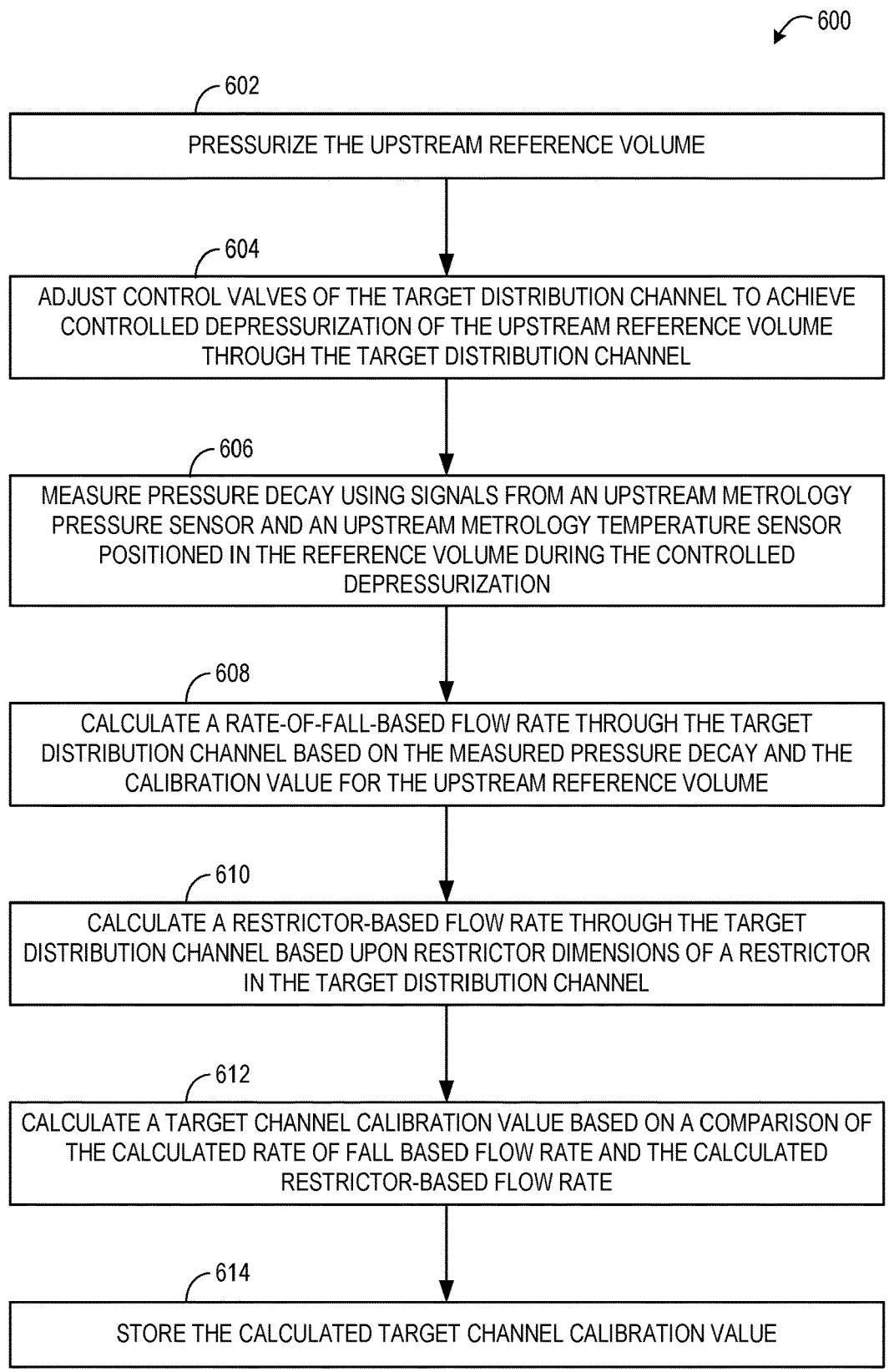
FIG. 7 shows a flowchart for a sixth method illustrating the performance of an in-situ rate of fall test to determine a calibration value for a target distribution channel in the system of FIG. 1.

FIG. 7 is a flowchart of a sixth method 600 illustrating the performance of an in-situ rate of fall test to determine a calibration value for a target distribution channel, as described in 208 of the second method 200.

At 602, the method includes pressurizing the upstream reference volume. At 604, the method includes adjusting control valves of the target distribution channel to achieve controlled depressurization of the upstream reference volume through the target distribution channel.

At 606, the method includes measuring pressure decay using signals from an upstream metrology pressure sensor and an upstream metrology temperature sensor positioned in the reference volume during the controlled depressurization. At 608, the method includes calculating a rate-of-fall-based flow rate through the target distribution channel based on the measured pressure decay and the calibration value for the upstream reference volume.

At 610, the method includes calculating a restrictor-based flow rate through the target distribution channel based upon restrictor dimensions of a restrictor in the target distribution channel. At 612, the method includes calculating a target channel calibration value based on a comparison of the calculated rate-of-fall-based flow rate and the calculated restrictor-based flow rate. At 614, the method includes storing the calculated target channel calibration value.

The above-described system and methods describe the operation of flow control valves of flow distribution channels in alternative control modes including a flow verification control mode and a flow ratio control mode. This configuration increases functionality while maintaining or even lowering material costs of manufacturing hardware.

Furthermore, the efficiency of process control in individual reaction chambers is enhanced. The MFCs of each process chamber can execute flow validation routines within a markedly reduced timeframe. This efficiency is achieved due to the shorter distances and reduced time of flight for controlling the flow within the system. The expedited process not only saves time but also improves the overall throughput of semiconductor manufacturing.

In accordance with this configuration, MFC flow verification routines can also be run in parallel, rather than in a serial manner. This parallel processing substantially decreases the duration required for tool qualification and chamber matching. By streamlining these processes, the system ensures a quicker setup and adjustment time, thereby enhancing the productivity of semiconductor manufacturing operations.

Additionally, this configuration enables in-situ verification of MFCs to monitor longer-term repeatability and drift. This in-situ verification process, conducted through the flow ratio controller channels, can maintain the reliability and precision of the flow control over extended periods by ensuring that any deviations from the desired flow parameters can be promptly identified and rectified, thereby sustaining the high standards of manufacturing quality.

Figure 8:
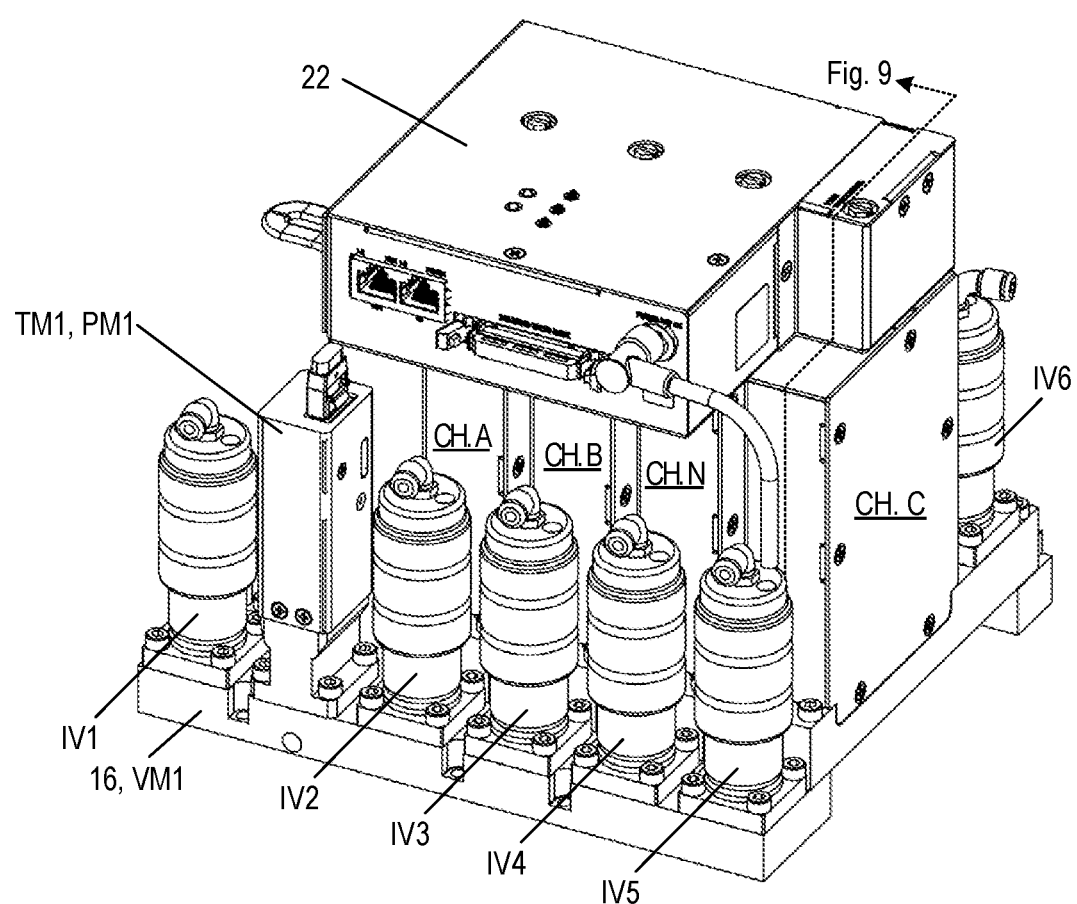
FIG. 8 is a perspective view of one example configuration of the flow ratio controller system of FIG. 1.

FIG. 8 is a perspective view of one example configuration of the flow ratio controller system of FIG. 1. A four channel configuration is illustrated with Channel N being positioned between Channel B and Channel C, which is the hybrid distribution channel 14C described above. Other components are labeled similarly to FIG. 1. Where sensors are co-packaged (such as TM1, PM1), a single lead line indicates the package in which the sensors are housed. It will be appreciated that mixture manifold 16 contains VM1, and these parts are also indicated with a single lead line FIG. 8. While four channels are depicted, it will be appreciated that additional channels may be added, or a fewer number of channels (greater than two) may be utilized. Further, while flow control valves are depicted on all of the distribution channels 14 in the depicted embodiment, it will be appreciated that in some configurations flow control valves may be omitted from a distribution channel (i.e., a so-called "open channel"), while a plurality of other distribution channels may be controlled by flow control valves.

Figure 9:
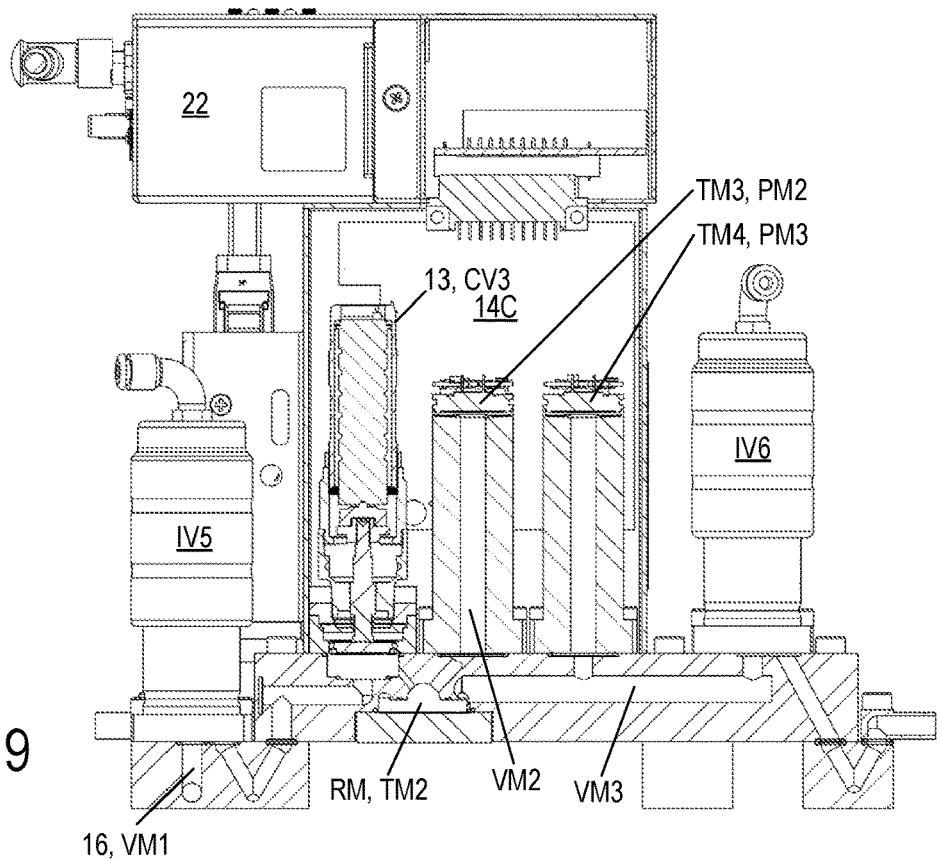
FIG. 9 is a partial cross sectional view of the example configuration of the flow ratio controller system of FIG. 8, taken along the dotted line in FIG. 8.

FIG. 9 is a partial cross sectional view of the example configuration of the flow ratio controller system of FIG. 8, taken along the dotted line in FIG. 8. The internal volumes VM1, VM2 and VM3 are visible in this view, as are the positions of the restrictor RM and metrology temperature sensor TM2.

Figure 10:
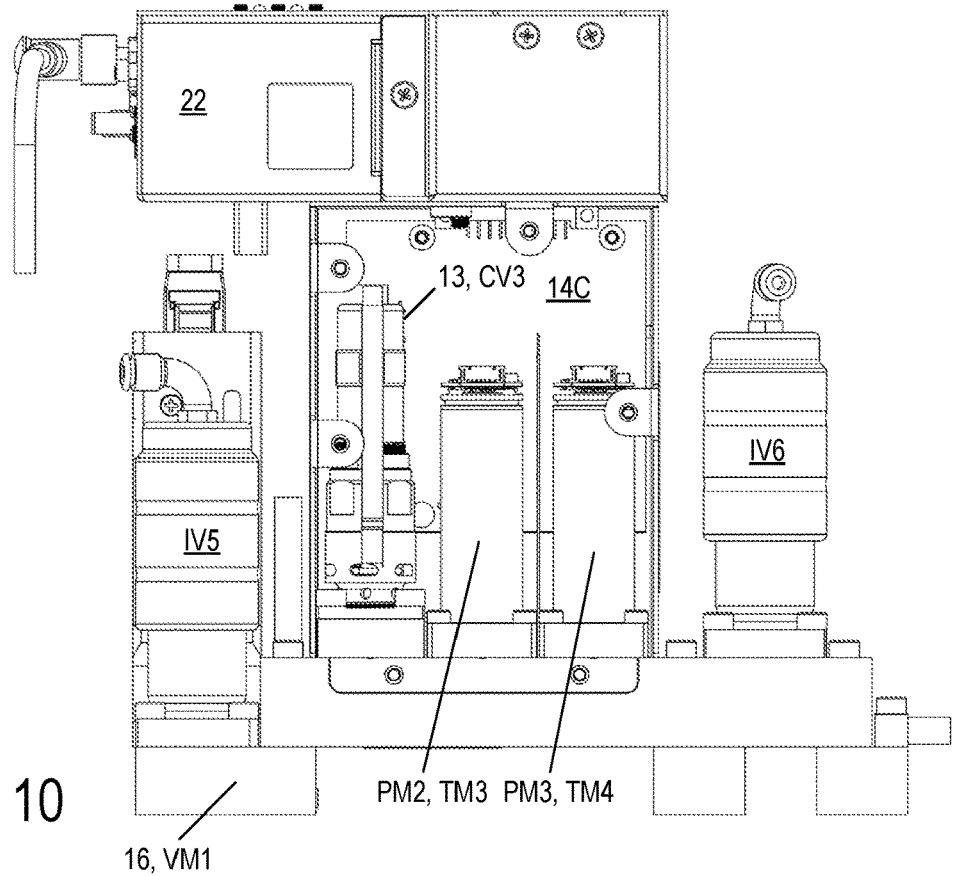
FIG. 10 is an end view of the example configuration of the flow ratio controller system of FIG. 8 taken from the same perspective as FIG. 9, with a cover of a channel removed.

FIG. 10 is an end view of the example configuration of the flow ratio controller system of FIG. 8 taken from the same perspective as FIG. 9, with a cover of the hybrid distribution channel 14C removed. The positions of metrology sensors PM2, TM3, as well as PM3 and TM4 are visible in this view.

As shown in FIGS. 9 and 10, isolation valve IV5 is positioned just upstream of the hybrid distribution channel 14C, while isolation valve IV6 is positioned just downstream of the same channel 14C, thereby regulating the flow of fluid within the hybrid distribution channel 14C. As depicted in FIG. 9, the upstream isolation valve IV5 is regulating the fluid flow from the upstream reference volume VM1 of the downstream manifold 16 into the hybrid distribution channel 14C.

Within the housing compartment containing the hybrid distribution channel 14C, the cylindrical housing containing the flow control valve CV3 integrated within the channel-specific flow controller 13 is adjacent one cylindrical housing which contains the first internal volume VM2, metrology temperature sensors TM2 and TM3, and the upstream metrology pressure sensor PM2. Another set of components, including the downstream metrology pressure sensor PM3, the downstream metrology temperature sensor TM4, and the second internal volume VM3, are contained within a separate cylindrical housing positioned adjacent the cylindrical housing containing the first internal volume VM2. These cylindrical housings are arranged in close proximity to each other, thereby increasing space utilization.

The controller 22 is physically mounted onto the hybrid distribution channel 14C to establish a direct data communication link with the channel-specific flow controller 13 and each of the sensors and valves, including the isolation valves IV5, IV6, pressure sensors PM2, PM3, temperature sensors TM2, TM3, TM4, and the restrictor RM, thereby reducing the latency in data transmission, which is advantageous in applications where fluid dynamics are sensitive and require precise, real-time monitoring and adjustments.

Figure 11:
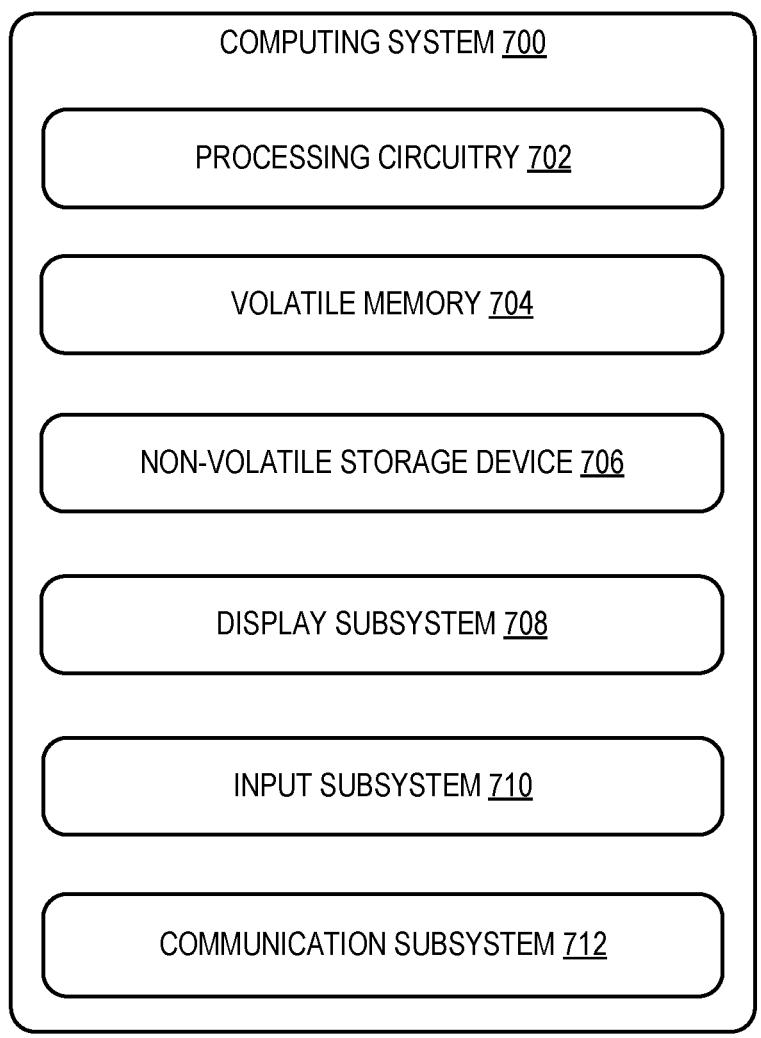
FIG. 11 shows a schematic view of an example computing environment in which the computing system of FIG. 1 may be enacted.

FIG. 11 schematically shows a non-limiting embodiment of a computing system 700 that can enact one or more of the methods and processes described above. Computing system 700 is shown in simplified form. Computing system 700 may embody the controller system 10 described above and illustrated in FIG. 1 and FIGS. 8-10. Components of computing system 700 may be included in one or more personal computers, server computers, tablet computers, home-entertainment computers, network computing devices, video game devices, mobile computing devices, mobile communication devices (e.g., smartphone), and/or other computing devices, and wearable computing devices such as smart wristwatches and head mounted augmented reality devices.

Computing system 700 includes processing circuitry 702, volatile memory 704, and a non-volatile storage device 706. Computing system 700 may optionally include a display subsystem 708, input subsystem 710, communication subsystem 712, and/or other components not shown in FIG. 11.

Processing circuitry typically includes one or more logic processors, which are physical devices configured to execute instructions. For example, the logic processors may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors configured to execute software instructions. Additionally or alternatively, the logic processor may include one or more hardware logic circuits or firmware devices configured to execute hardware-implemented logic or firmware instructions. Processors of the processing circuitry 702 may be single-core or multi-core, and the instructions executed thereon may be configured for sequential, parallel, and/or distributed processing. Individual components of the processing circuitry optionally may be distributed among two or more separate devices, which may be remotely located and/or configured for coordinated processing. For example, aspects of the computing system disclosed herein may be virtualized and executed by remotely accessible, networked computing devices configured in a cloud-computing configuration. In such a case, these virtualized aspects are run on different physical logic processors of various different machines, it will be understood. These different physical logic processors of the different machines will be understood to be collectively encompassed by processing circuitry 702.

Non-volatile storage device 706 includes one or more physical devices configured to hold instructions executable by the processing circuitry to implement the methods and processes described herein. When such methods and processes are implemented, the state of non-volatile storage device 706 may be transformed—e.g., to hold different data.

Non-volatile storage device 706 may include physical devices that are removable and/or built in. Non-volatile storage device 706 may include optical memory, semiconductor memory, and/or magnetic memory, or other mass storage device technology. Non-volatile storage device 706 may include nonvolatile, dynamic, static, read/write, read-only, sequential-access, location-addressable, file-addressable, and/or content-addressable devices. It will be appreciated that non-volatile storage device 706 is configured to hold instructions even when power is cut to the non-volatile storage device 706.

Volatile memory 704 may include physical devices that include random access memory. Volatile memory 704 is typically utilized by processing circuitry 702 to temporarily store information during processing of software instructions. It will be appreciated that volatile memory 704 typically does not continue to store instructions when power is cut to the volatile memory 704.

Aspects of processing circuitry 702, volatile memory 704, and non-volatile storage device 706 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 700 typically implemented in software by a processor to perform a particular function using portions of volatile memory, which function involves transformative processing that specially configures the processor to perform the function. Thus, a module, program, or engine may be instantiated via processing circuitry 702 executing instructions held by non-volatile storage device 706, using portions of volatile memory 704. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 708 may be used to present a visual representation of data held by non-volatile storage device 706. The visual representation may take the form of a graphical user interface (GUI). As the herein described methods and processes change the data held by the non-volatile storage device, and thus transform the state of the non-volatile storage device, the state of display subsystem 708 may likewise be transformed to visually represent changes in the underlying data. Display subsystem 708 may include one or more display devices utilizing virtually any type of technology. Such display devices may be combined with processing circuitry 702, volatile memory 704, and/or non-volatile storage device 706 in a shared enclosure, or such display devices may be peripheral display devices.

When included, input subsystem 710 may comprise or interface with one or more user-input devices such as a keyboard, mouse, touch screen, camera, or microphone.

When included, communication subsystem 712 may be configured to communicatively couple various computing devices described herein with each other, and with other devices. Communication subsystem 712 may include wired and/or wireless communication devices compatible with one or more different communication protocols. As non-limiting examples, the communication subsystem may be configured for communication via a wired or wireless local- or wide-area network, broadband cellular network, etc. In some embodiments, the communication subsystem may allow computing system 700 to send and/or receive messages to and/or from other devices via a network such as the Internet.

"And/or" as used herein is defined as the inclusive or $\vee$, as specified by the following truth table:

| A | B | A $\vee$ B |
|---|---|---|
| True | True | True |
| True | False | True |
| False | True | True |
| False | False | False |

To the extent that terms "includes," "including," "has," "contains," and variants thereof are used herein, such terms are intended to be inclusive in a manner similar to the term "comprises" as an open transition word without precluding any additional or other elements.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed. If used herein, the phrase "and/or" means any or all of multiple stated possibilities.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A flow ratio controller system, comprising:
   an inlet configured to receive a total inlet fluid flow;
   a plurality of distribution channels fluidically connected to the inlet and arranged in parallel in a branching flow path downstream of the inlet, each of the plurality of distribution channels being provided with respective valves and being configured to carry a respective portion of the total inlet fluid flow, the plurality of distribution channels including a hybrid distribution channel; and
   a controller operatively coupled to each of the plurality of distribution channels, the controller being configured to selectively operate in alternative control modes including a flow verification control mode and a flow ratio control mode, wherein
   in the flow verification control mode, the controller is configured to:
      perform a first rate-of-pressure-change test on a first target flow path that extends from the inlet through a reference volume to the hybrid distribution channel, using measurements from a mass flow meter in the hybrid distribution channel, to thereby calculate a calibrated value for the reference volume;
      perform verification of a flow rate value measured by a mass flow meter in a target distribution channel of the plurality of distribution channels other than the hybrid distribution channel, by conducting a second rate-of-pressure-change test on a second target flow path from the inlet through the reference volume to the target distribution channel, using the calibrated value for the reference volume, to thereby calculate a target channel calibration value for the mass flow meter in the target distribution channel; and
      calibrate the mass flow meter in the target distribution channel using the target channel calibration value; and
   in the flow ratio control mode, the controller is configured control each of the plurality of distribution channels including the hybrid distribution channel, according to a respective flow ratio setpoint for each distribution channel.

2. The flow ratio controller system of claim 1, wherein to perform the first rate-of-pressure-change test, the controller is configured to:
   control the valves along the branching flow path to establish the first target flow path;
   establish controlled compression or decompression of the reference volume using a calibrated total inlet flow having a first predetermined mass flow rate value;

measure a temperature change and a pressure change in the hybrid distribution channel during the controlled compression or decompression using a temperature sensor and pressure sensor in the hybrid distribution channel, respectively;

calculate a calibrated value for the reference volume based on the measured temperature change, the measured pressure change, the first predetermined mass flow rate value, and a gas constant.

3. The flow ratio controller system of claim 2, wherein to perform verification of the flow rate value measured by the mass flow meter in the target distribution channel in the flow verification control mode, the controller is further configured to:

control valves along the branching flow path to establish the second target flow path between the inlet and only the target distribution channel, the second target flow path including the reference volume;

establish controlled compression or decompression of the reference volume while the second target flow path is established using a calibrated total inlet flow having a second predetermined mass flow rate value;

measure a pressure change and a temperature change using the temperature sensor and pressure sensor in the target distribution channel during the controlled compression or decompression while the second target flow path is established;

calculating a rate-of-change-based flow rate through the target distribution channel based on the measured pressure change, the measured temperature change, the calibration value for the reference volume, and the second predetermined mass flow rate value; and calculating a restrictor-based flow rate through the target distribution channel based upon restrictor dimensions of a restrictor in the target distribution channel and the second predetermined mass flow rate value;

wherein the target channel calibration value is calculated based on a comparison of the calculated rate-of-change-based flow rate and the calculated restrictor-based flow rate.

4. The flow ratio controller system of claim 2, wherein the controller is configured to measure the temperature change and measure the pressure change by measuring an initial pressure and initial temperature and a later pressure and later temperature in the hybrid distribution channel as a result of the controlled compression or decompression; and wherein the calibrated value for the reference volume is computed using the ideal gas law, the measured initial pressure, measured initial temperature, measured later pressure, measured later temperature, the gas constant, and the mass flow rate of the calibrated total inlet flow.

5. The flow ratio controller system of claim 2, wherein the inlet is formed on an upstream side of a manifold; and the controller is configured to perform verification using, as the reference volume, an upstream reference volume provided in the manifold on the branching flow path downstream of the inlet and upstream of a mass flow meter situated in the hybrid distribution channel.

6. The flow ratio controller system of claim 5, wherein the manifold includes an upstream metrology pressure sensor and an upstream metrology temperature sensor positioned in the upstream reference volume and operatively coupled to the controller.

7. The flow ratio controller system of claim 5, wherein the plurality of distribution channels includes a high flow distribution channel that branches from the manifold from a point upstream of a branch point for the hybrid distribution channel and that includes a downstream reference volume with isolation valves on an upstream side and a downstream side.

8. The flow ratio controller system of claim 1, wherein the reference volume is an intermediate reference volume that is provided on the branching flow path downstream of the inlet and upstream of the mass flow meter situated in the hybrid distribution channel.

9. The flow ratio controller system of claim 8, wherein the temperature sensor in the hybrid distribution channel is a metrology temperature sensor positioned in the intermediate reference volume; and the pressure sensor in the hybrid distribution channel is a metrology pressure sensor positioned in the intermediate reference volume.

10. The flow ratio controller system of claim 9, wherein the metrology temperature sensor is one of a pair of metrology pressure sensors in the hybrid distribution channel, and the metrology pressure sensor is one of a pair of metrology temperature sensors positioned on each side of the restrictor.

11. The flow ratio controller system of claim 1, wherein the inlet receives the total inlet flow from one or more inlet channels having one or more respective mass flow controllers; and in the flow verification control mode, the controller is further configured to perform verification of a mass flow rate value measured by a target mass flow controller in a target inlet channel, using measurements from a pressure sensor and a temperature sensor in the hybrid distribution channel, calculate a target mass flow controller calibration value, and calibrate the mass flow controller in the target inlet channel using the target mass flow controller calibration value.

12. The flow ratio controller system of claim 1, wherein the hybrid distribution channel includes a sequence of components including a respective one of the valves, a first internal volume, a metrology temperature sensor configured to measure a temperature of the first internal volume, an upstream metrology temperature sensor and an upstream metrology pressure sensor, a restrictor, a downstream metrology temperature sensor and a downstream metrology pressure sensor, and a second internal volume, aligned in this order in a downstream flow direction of the hybrid distribution channel.

13. The flow ratio controller system of claim 12, wherein an accuracy of the upstream metrology pressure sensor and the downstream metrology pressure sensor is an accuracy value within ±0.1% of FS (full scale); and a temperature coefficient of the upstream metrology temperature sensor and the downstream metrology temperature sensor is an accuracy value within ±0.02% of FS/° C. (full scale).

14. The flow ratio controller system of claim 12, wherein the upstream metrology pressure sensor and the downstream metrology pressure sensor are MEMS (micro-electromechanical systems) oscillating type pressure sensors.

15. The flow ratio controller system of claim 12, wherein a diameter of a channel in the restrictor is less than 50 micrometers; and a length of the channel in the restrictor is more than 10 millimeters and less than 50 millimeters.

16. The flow ratio controller system of claim 1, further comprising:

an additional distribution channel in the branching flow path downstream of the inlet, the additional distribution channel being provisioned without a flow control valve and being configured to carry a respective portion of the total inlet fluid flow.

17. The flow ratio controller system of claim 1, wherein the hybrid distribution channel further comprises a mass flow control device with a restrictor comprising ceramic material; and
an internal flow channel of the restrictor is shaped within the ceramic material.

18. A flow ratio controller method for use with a flow ratio controller including an inlet configured to receive a total inlet fluid flow, and a plurality of distribution channels fluidically connected to the inlet and arranged in parallel in a branching flow path downstream of the inlet, each of the plurality of distribution channels being provided with respective valves and being configured to carry a respective portion of the total inlet fluid flow, the plurality of distribution channels including a hybrid distribution channel, the method comprising:
   executing a flow verification control mode, including
      performing a first rate-of-pressure-change test on a first target flow path that extends from the inlet through a reference volume to the hybrid distribution channel, using measurements from a mass flow meter in the hybrid distribution channel, to thereby calculate a calibrated value for the reference volume;
      performing verification of a flow rate value measured by a mass flow meter in a target distribution channel of the plurality of distribution channels other than the hybrid distribution channel, by conducting a second rate-of-pressure-change test on a second target flow path from the inlet through the reference volume to the target distribution channel, using the calibrated value for the reference volume, to thereby calculate a target channel calibration value for the mass flow meter in the target distribution channel; and
      calibrate the mass flow meter in the target distribution channel using the target channel calibration value; and
   executing a flow ratio control mode, in which each of the plurality of distribution channels including the hybrid distribution channel is controlled according to a respective flow ratio setpoint for each distribution channel.

19. The flow ratio controller method of claim 18, wherein performing the first rate-of-pressure-change test, includes:
   controlling the valves along the branching flow path to establish the first target flow path;
   establishing controlled compression or decompression of the reference volume using a calibrated total inlet flow having a first predetermined mass flow rate value;
   measuring a temperature change and a pressure change in the hybrid distribution channel during the controlled compression or decompression using a temperature sensor and pressure sensor in the hybrid distribution channel, respectively; and
   calculating a calibrated value for the reference volume based on the measured temperature change, the measured pressure change, the first predetermined mass flow rate value, and a gas constant; and
performing verification of the flow rate value measured by the mass flow meter in the target distribution channel in the flow verification control mode, includes:
   controlling valves along the branching flow path to establish the second target flow path between the inlet and only the target distribution channel, the second target flow path including the reference volume;
   establishing controlled compression or decompression of the reference volume while the second target flow path is established using a calibrated total inlet flow having a second predetermined mass flow rate value;
   measuring a pressure change and a temperature change using the temperature sensor and pressure sensor in the target distribution channel during the controlled compression or decompression while the second target flow path is established;
   calculating a rate-of-change-based flow rate through the target distribution channel based on the measured pressure change, the measured temperature change, the calibration value for the reference volume, and the second predetermined mass flow rate value; and
   calculating a restrictor-based flow rate through the target distribution channel based upon restrictor dimensions of a restrictor in the target distribution channel and the second predetermined mass flow rate value;
   wherein the target channel calibration value is calculated based on a comparison of the calculated rate-of-change-based flow rate and the calculated restrictor-based flow rate.

20. A flow ratio controller system, comprising:
an inlet configured to receive a total inlet fluid flow;
a plurality of distribution channels fluidically connected to the inlet and arranged in parallel in a branching flow path downstream of the inlet, each of the plurality of distribution channels being configured to carry a respective portion of the total inlet fluid flow, the plurality of distribution channels including a hybrid distribution channel; and
a controller operatively coupled to the plurality of distribution channels, the controller being configured to selectively operate in alternative control modes including a flow verification control mode and a flow ratio control mode, wherein in the flow verification control mode the controller is configured to:
   control valves along the branching flow path to establish a first target flow path between the inlet and only the hybrid distribution channel, the first target flow path including a reference volume;
   establish controlled compression or decompression of the reference volume;
   measure a first temperature change and a first pressure change in the hybrid distribution channel during the controlled compression or decompression;
   calculate a calibrated value for the reference volume based at least in part on the measured first temperature change and measured first pressure change;
   control valves along the branching flow path to establish a second target flow path between the inlet and only a target distribution channel including a target mass flow meter, the second target flow path including the reference volume;
   establish controlled compression or decompression of the reference volume while the second target flow path is established;
   measure a second pressure change and a second temperature change using a temperature sensor and a pressure sensor in the target distribution channel during the controlled compression or decompression while the second target flow path is established;

calculating a rate-of-change-based flow rate through the target distribution channel based at least in part on the measured second pressure change and second temperature change;
calculating a restrictor-based flow rate through the target distribution channel based at least in part on the measured second pressure change and second temperature change;
calculating a target channel calibration value based on a comparison of the calculated rate-of-change-based flow rate and the calculated restrictor-based flow rate; and
calibrating the target distribution channel using the target channel calibration value; and wherein in the flow ratio control mode, the controller is configured control each of the plurality of distribution channels including the hybrid distribution channel and the target distribution channel with the calibrated mass flow meter, according to a respective flow ratio setpoint for each distribution channel.

* * * * *